(12) United States Patent
Cheng

(10) Patent No.: US 7,517,030 B2
(45) Date of Patent: Apr. 14, 2009

(54) SLIDE RAIL STRUCTURE FOR INDUSTRY-USED COMPUTERS

(75) Inventor: Chi-Tsun Cheng, Taoyuan County (TW)

(73) Assignee: LIF J.K. Corporation, Gueishan Township, Taoyuan Country (TW)

( * ) Notice: Subject to any disclaimer, the term of this patent is extended or adjusted under 35 U.S.C. 154(b) by 138 days.

(21) Appl. No.: 11/451,357

(22) Filed: Jun. 13, 2006

(65) Prior Publication Data

US 2007/0284981 A1 Dec. 13, 2007

(51) Int. Cl.
A47B 88/04 (2006.01)
(52) U.S. Cl. ................................ 312/334.1; 312/333
(58) Field of Classification Search .............. 312/334.1, 312/334.4, 334.7, 334.8, 265.1, 334.22, 333; 211/26, 175; 361/683
See application file for complete search history.

(56) References Cited

U.S. PATENT DOCUMENTS

| 3,160,448 | A  | * | 12/1964 | Abernathy et al. | ............ | 384/23 |
| 6,659,292 | B2 | * | 12/2003 | Gough et al. | ............ | 211/26 |
| 6,840,388 | B2 | * | 1/2005 | Mayer | ............ | 211/26 |
| 2002/0074914 | A1 | * | 6/2002 | Shih | ............ | 312/334.4 |
| 2003/0136749 | A1 | * | 7/2003 | Williams et al. | ............ | 211/26 |

* cited by examiner

Primary Examiner—James O Hansen

(57) ABSTRACT

A slide rail structure for industry-used computers comprises a pair of slide elements mounted on two opposite lateral sides of a computer chassis, each having a stepped inner surface with an elongated hole, and a pair of rail mounted on two opposite lateral inner walls of a computer cabinet, each being capable of being inserted into a corresponding elongated hole, whereby inner stepped surfaces of the slide elements and the rails will be smoothly engaged. Therefore, the slide elements, moving together with the computer chassis, will slide along the rails.

1 Claim, 7 Drawing Sheets

SLIDE RAIL STRUCTURE FOR INDUSTRY-USED COMPUTERS

FIELD OF THE INVENTION

The present invention relates to slide rails for mounting industry-used computers, more particularly to a slide rail structure for industry-used computers mounted between a computer chassis and a computer cabinet, whereby the computer will slide smoothly and steady relative to the cabinet. The slide rail structure comprises a pair of slide elements mounted on two opposite lateral sides of a computer chassis and a pair of rail mounted on two opposite lateral inner walls of a computer cabinet, whereby the slide elements, moving together with the computer chassis, will slide along the rails. The present invention is compact and simple, therefore not only saving space but also easy to make.

BACKGROUND OF THE INVENTION

Referring to FIG. 1, a conventional slide rail structure for mounting industry-used computers comprises a plurality of slide plates, each having a width between 1.6 to 2 cm and therefore taking an appreciable space. This will hinder the installation of a computer when the inner space of a cabinet is tight. Further, the conventional rail structure is complicated and difficult to assemble, resulting in a high production cost. The multiple slide pieces also require higher manufacturing precision, causing a higher fault rate when they are in service. Referring to FIG. 2, a simple rail structure disclosed by the R.O.C. patent number 89216454 aiming at improving the above problems has a base (A) and a slide element (B, which consists of a single piece), integrated by punch casting. The structure is simple but still complicated to make. For example, the punch casting will result in unsmoothness about a folded section, making the fold angle control difficult. The imperfection caused by the punch casting would cause unsmooth slide motion of the slide elements relative to the base and a large friction therebetween.

SUMMARY OF THE INVENTION

Accordingly, the primary objective of the present invention is to provide a slide rail structure for industry-used computers that comprises a pair of slide elements mounted on two opposite lateral sides of a computer chassis and a pair of rail mounted on two opposite lateral inner walls of a computer cabinet, whereby the slide elements, moving together with the computer chassis, will slide along the rails. The present invention is compact and simple, therefore not only saving space but also easy to make.

The secondary objective of the present invention is to provide a slide rail structure for industry-used computers whereby the slide elements are confined well by the rails, assuring a smooth and stable slide motion.

It is a further objective of the present invention that the rails of the present invention are very flat, therefore not occupying too much space in a cabinet.

The various objects and advantages of the present invention will be more readily understood from the following detailed description when read in conjunction with the appended drawings.

DETAILED DESCRIPTION OF THE PREFERRED EMBODIMENTS

Figure 1:
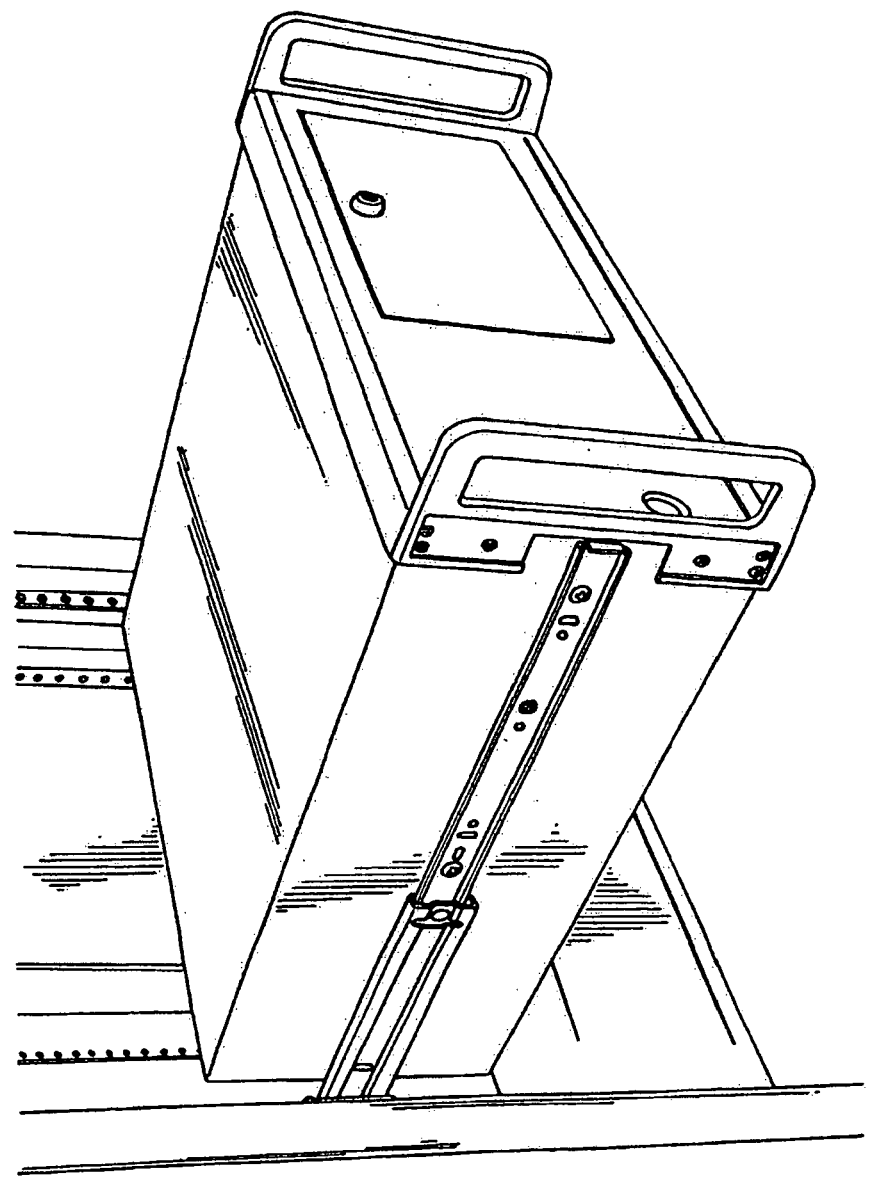
FIG. 1 is a perspective view of a slide rail structure for industry-used computers of the prior art.
Figure 2:
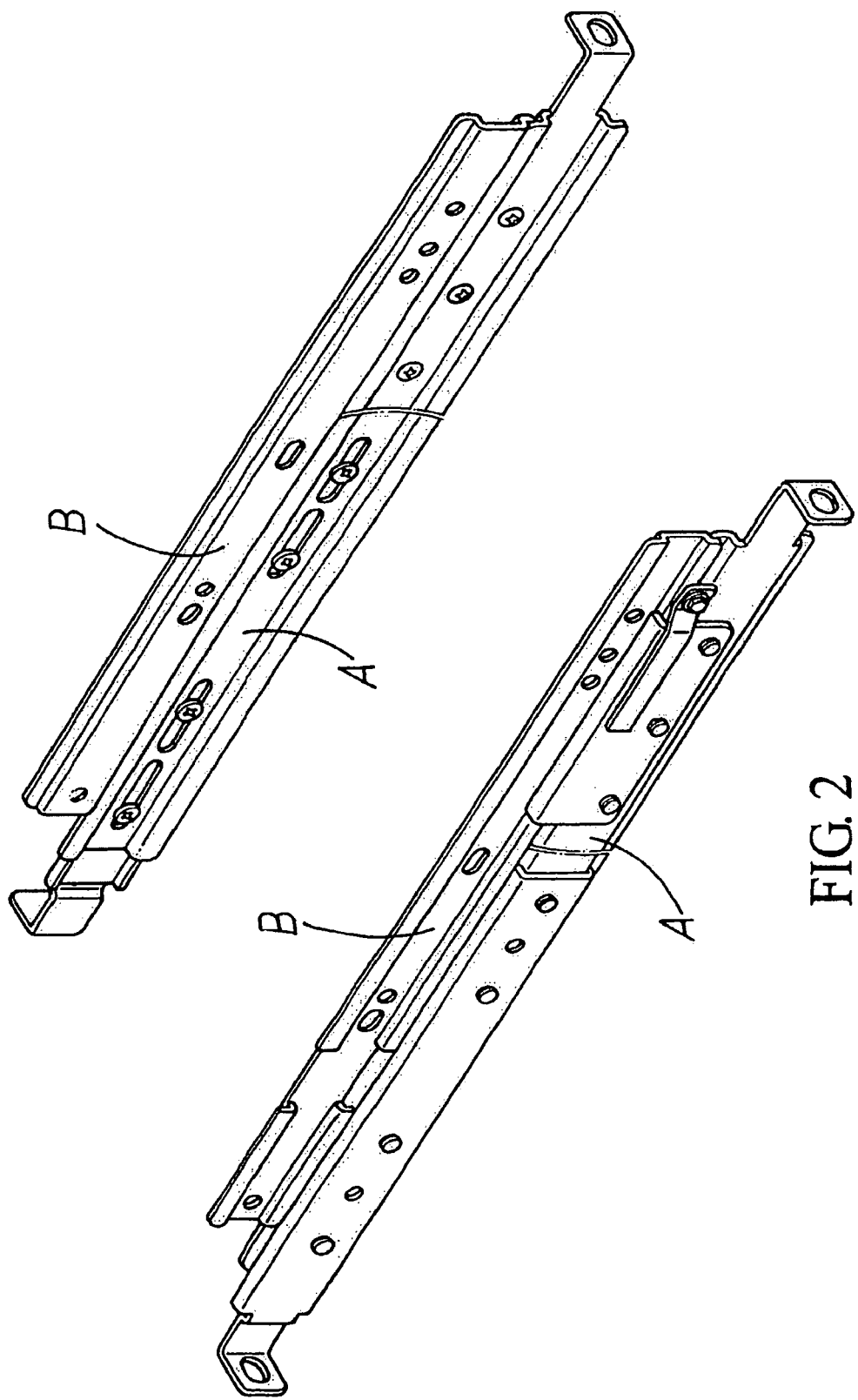
FIG. 2 is the slide rail structure for industry-used computers disclosed by R.O.C. patent number 89216454.
Figure 3:
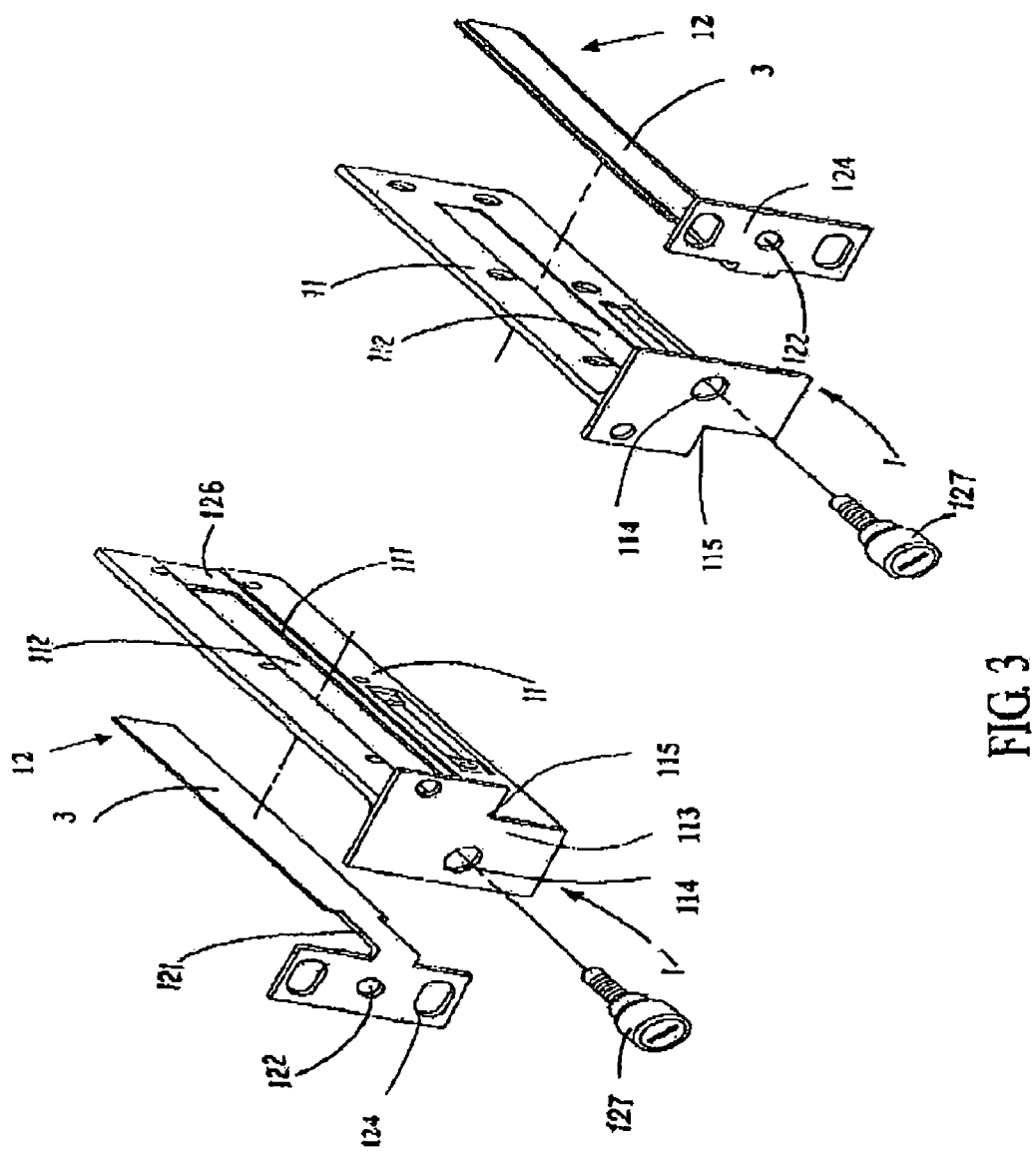
FIG. 3 is a perspective view of a slide rail structure for industry-used computers of the present invention.
Figure 4:
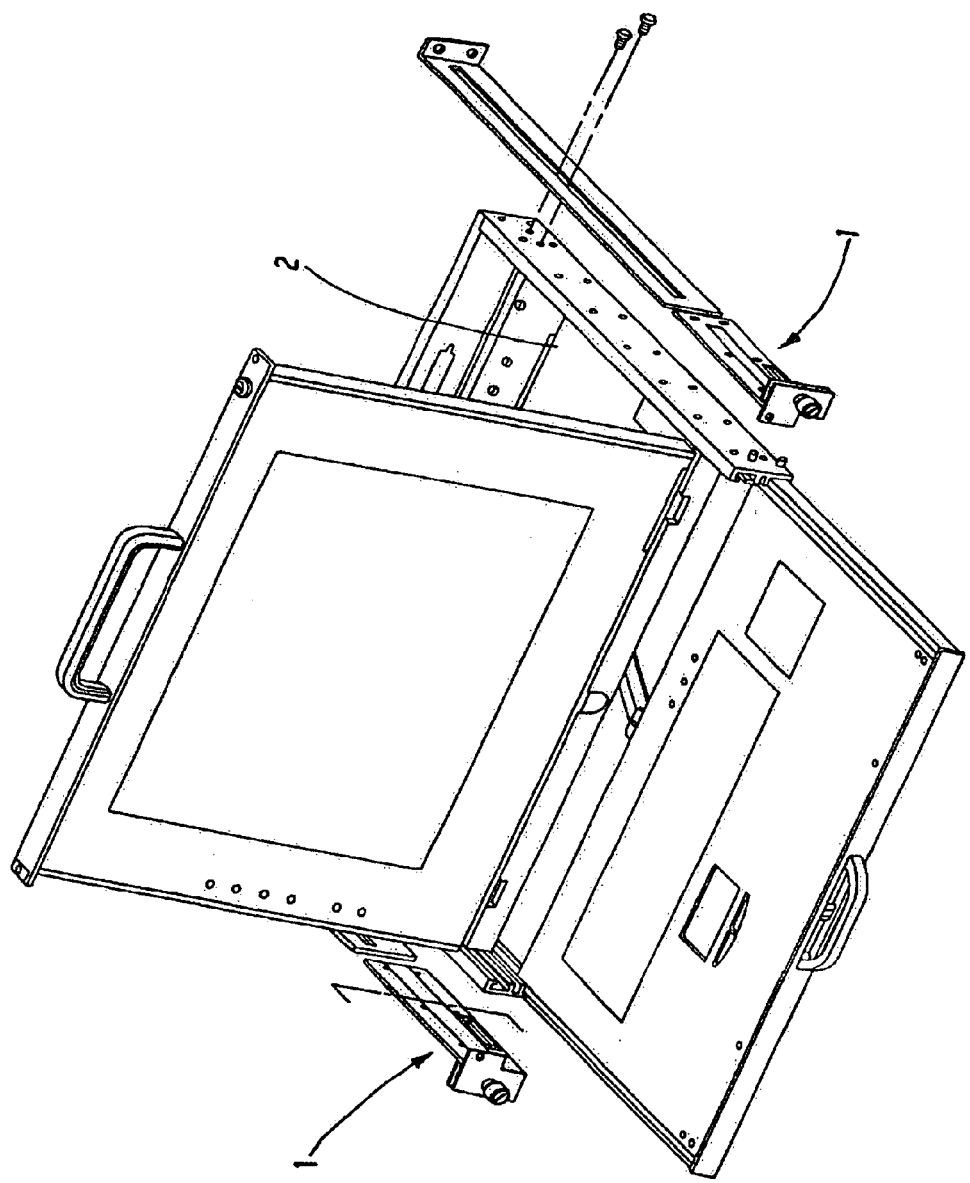
FIG. 4 illustrates a computer being mounted on the slide rail structure for industry-used computers in FIG. 3 within a computer cabinet.
Figure 5:
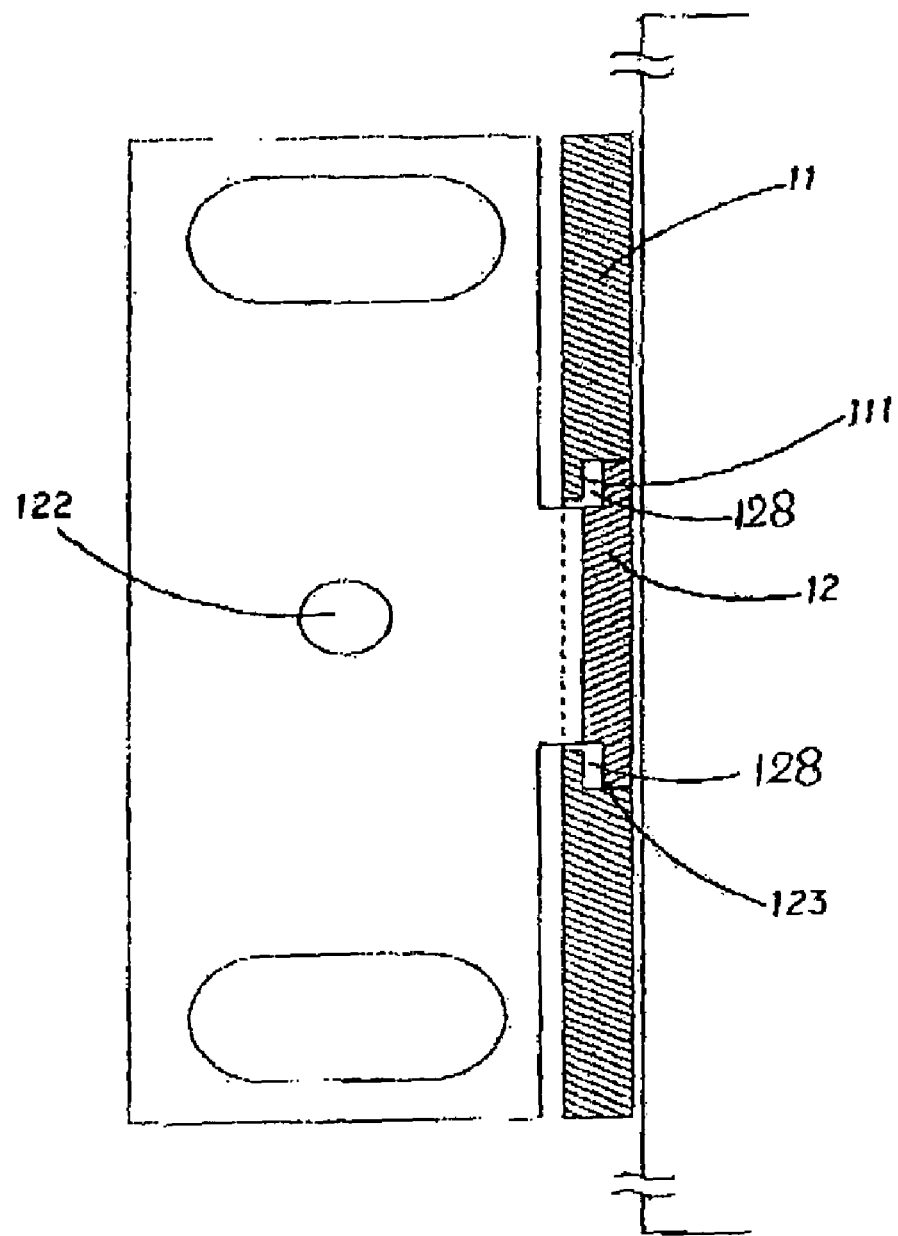
FIG. 5 is an enlarged cross-sectional view of the combined structure of a sliding element and the associated rail.
Figure 6:
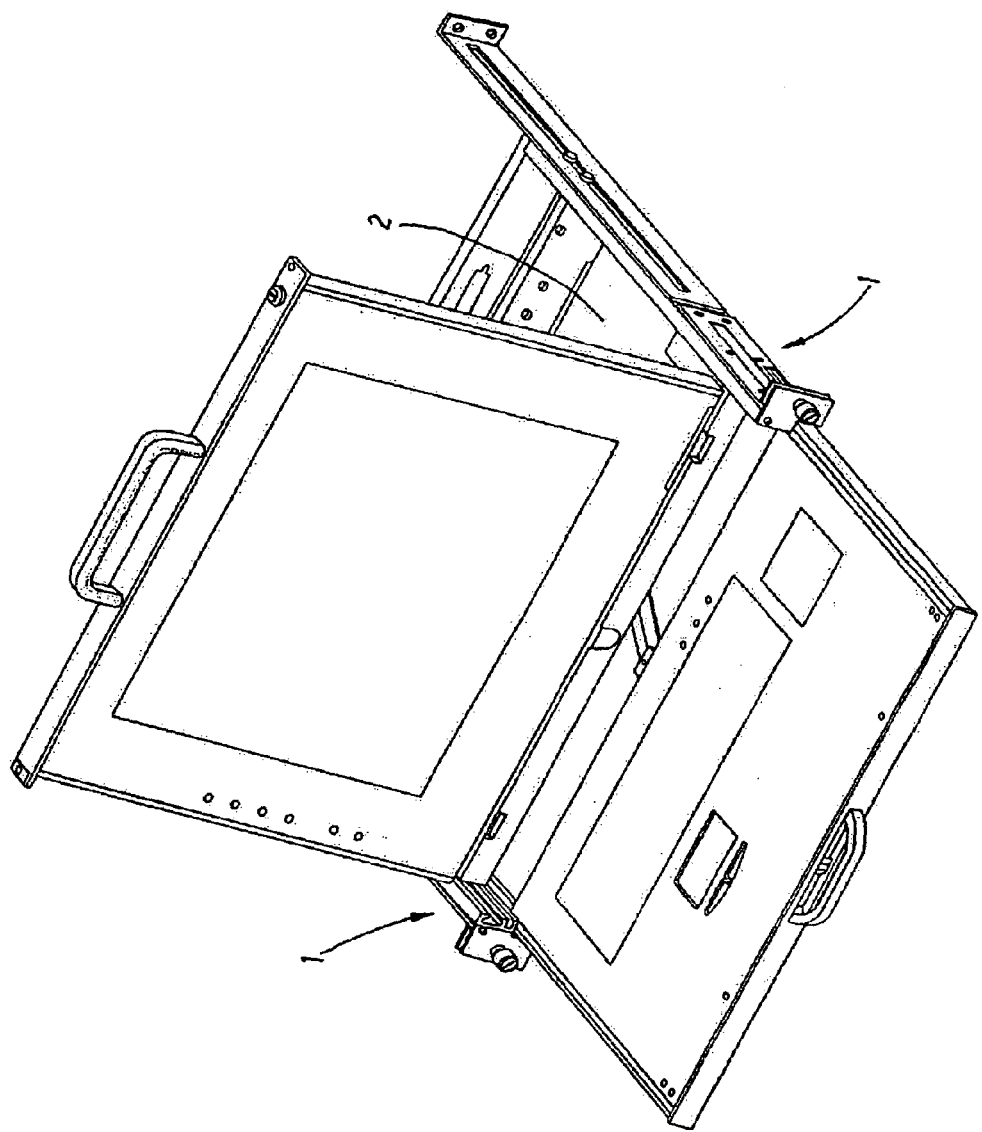
FIG. 6 is a perspective view of the slide rail structure for industry-used computers in FIG. 3, after the computer is connected to the cabinet.
Figure 7:
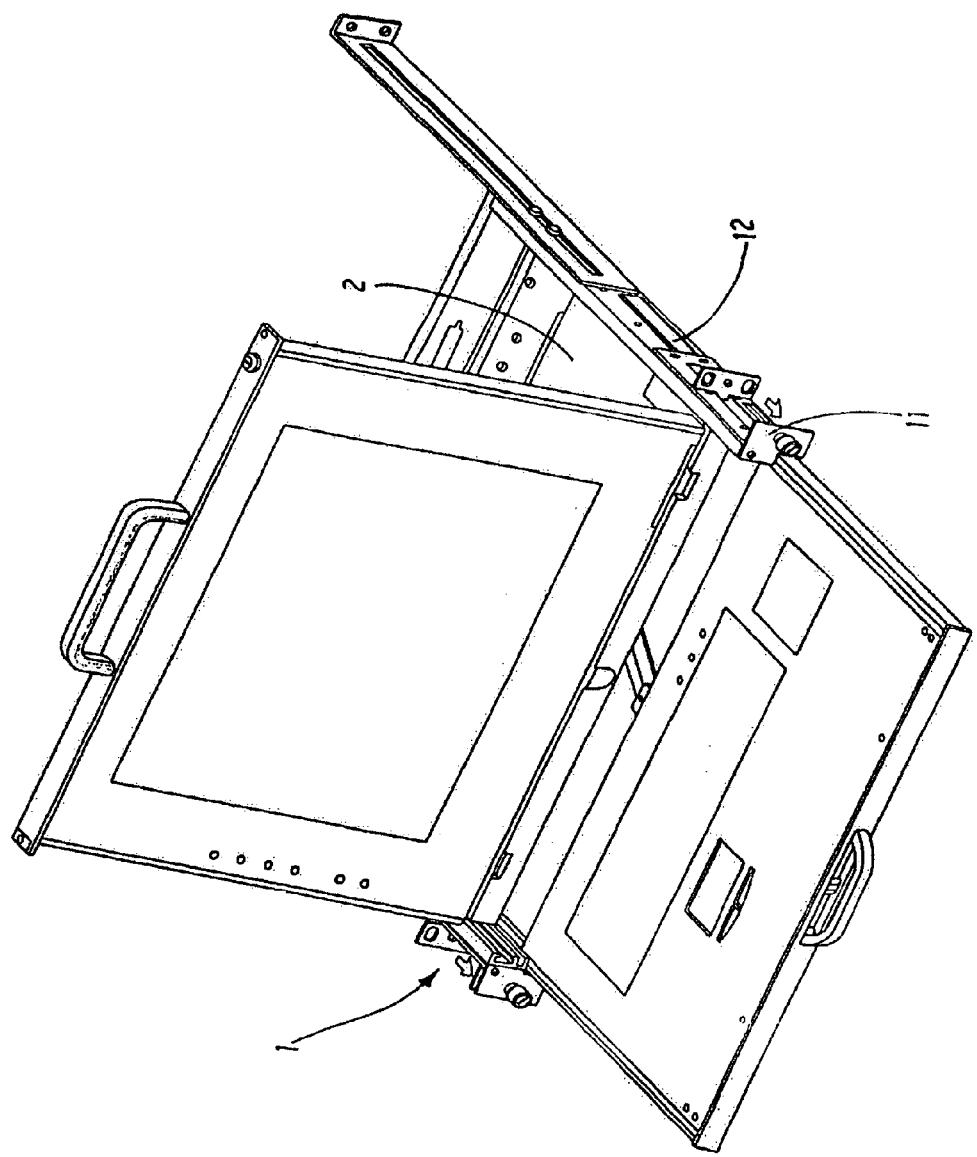
FIG. 7 is another perspective view of the slide rail structure for industry-used computers in FIG. 6 when pulled out.

Referring to FIGS. 3 to 5, a slide rail structure for industry-used computers comprises a pair of slide rails 1 are disposed between a computer chassis 2 and a computer cabinet (not shown); each of the slide rails 1 further comprises a slide element 11 and a fixed rail 12. The inner side of each of the slide elements 11 is provided with a pair of up and down arranged stepped surfaces 111 in which an elongated hole 112 forms. Each of the rails 12 is provided with a narrower neck section 121 extending into the corresponding one of the rails 12. Each of the slide elements 11 is inserted into a corresponding elongated hole 112. By slightly rotating the slide elements 11, they will be engaged smoothly with the elongated holes 112 on respective stepped surfaces 111. The screw holes 122 on the front faces will be then aligned with the cabinet and locked by screws 127. Thereby, the rails 12 will be confined between respective pairs of stepped surfaces 111. Since the slide elements 11 are mounted on the outer sidewalls of the chassis 2, a pair of slide grooves are formed between the stepped surfaces 111 and the chassis 2, as shown in FIG. 5. The rails 12 are attached on the opposite inner walls of the computer cabinet, as shown in FIGS. 6 and 7, whereby the slide elements 11, moving together with the computer chassis 2, will slide along the rails 12. The present invention is compact and simple, therefore not only saving space but also easy to make. The stepped surfaces 111 forms a recess 126. After assembly, the two fixed rails 12 will be engaged to the recesses of the two sliding elements 12, respectively; so that the longitudinal rectangular sheet 123 is retained on the recessed stepped surfaces 111; thereby, the rails 12 will be confined between respective pairs of stepped surfaces 111. A pair of slide grooves (128) are formed between the stepped surfaces (111) and the chassis (2). Rotation of each fixed rail (12) allows the narrow neck section (121) to pass through the elongated penetrating hole (112) and seat the longitudinal rectangular sheet within the respective slide groove: and a thickness of the longitudinal rectangular sheet (123) is less than a dimension measured from the recess (126) to the inner side.

Referring to FIGS. 5 and 6, the computer chassis 2, a narrower stepped face 123 is formed on each of the rails 12 at its supporting face against a corresponding slide element 11, whereby the stepped face 123 will reduce the frictional force as the slide element 11 slides against the rail 12.

The present invention is thus described, and it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A slide rail structure for industry-used computers, comprising: a pair of slide rails (1); each of the slide rails (1) further comprising a fixed rail (12) and a slide element (11);

each fixed rail (12) being provided with a narrow neck section (121); one slide of the fixed rail (12) being formed with a longitudinal rectangular sheet (123) and another side thereof being formed with a transversal front sheet (124); and a screw hole (122) being formed on the transversal front sheet of the fixed rail (12);

each slide element (11) having an inner side with a pair of up an down arranged stepped surface (111) in which an elongated penetrating hole (112) is formed; one end of each slide element (11) being formed with a stop plate (113); the stop plate (113) being "L"-shaped and formed with a screw hole (114); the stepped surfaces (111) forming a recess (126); wherein after assembly, the two fixed rails (12) will be engaged to the recesses of the two sliding elements (12), respectively; so that the longitudinal rectangular sheet (123) is retained on the recessed stepped surfaces (111); thereby, the rails (12) will be confined between respective pairs of stepped surfaces (111);

screws (127) for aligning the screw hole (122) of the fixed rail (12) with the screw hole (114) of the slide element (11); and a chassis (2); and wherein when the slide elements (11) are mounted onto outer sidewalls of the chassis (2); a pair of slide grooves (128) are formed between the stepped surfaces (111) and the chassis (2); rotation of each fixed rail (12) allows the narrow neck section (121) to pass through the elongated penetrating hole (112) and seat the longitudinal rectangular sheet (123) within the respective slide groove; and wherein a thickness of the longitudinal rectangular sheet (123) is less than a dimension measured from the recess (126) to the inner side.

* * * * *